(12) United States Patent
Lee et al.

(10) Patent No.: US 9,023,478 B2
(45) Date of Patent: May 5, 2015

(54) MICROPATTERNING OF CONDUCTIVE GRAPHITE PARTICLES USING MICROCONTACT PRINTING

(75) Inventors: Ilsoon Lee, Okemos, MI (US); Lawrence T. Drzal, Okemos, MI (US); Jue Lu, Okemos, MI (US); Troy R. Hendricks, Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 13/619,696

(22) Filed: Sep. 14, 2012

(65) Prior Publication Data
US 2013/0009825 A1 Jan. 10, 2013

Related U.S. Application Data

(62) Division of application No. 12/515,232, filed as application No. PCT/US2007/023985 on Nov. 15, 2007, now abandoned.

(60) Provisional application No. 60/859,297, filed on Nov. 15, 2006.

(51) Int. Cl.
*B32B 9/00* (2006.01)
*G03F 7/00* (2006.01)
(Continued)

(52) U.S. Cl.
CPC ............... *G03F 7/0002* (2013.01); *C01B 31/04* (2013.01); *B82Y 10/00* (2013.01); *B82Y 40/00* (2013.01);
(Continued)

(58) Field of Classification Search
CPC ............................ B32B 2313/04; C01B 31/04
USPC ................ 428/408; 423/447.1, 448; 977/774; 252/500
See application file for complete search history.

(56) References Cited

U.S. PATENT DOCUMENTS

2003/0096149 A1* 5/2003 Koyama et al. ............... 429/33
2003/0152703 A1 8/2003 Hammond et al.
(Continued)

FOREIGN PATENT DOCUMENTS

GB 2 432 257 A 5/2007
WO 01/84238 A 11/2001
(Continued)

OTHER PUBLICATIONS

Hendricks et al: "A versitile approach to selective and inexpensive copier patterns using polyelectrolyte multilayer coatings", Thin Solid Films, Elsevier-Sequoia S. A. Lausanne, CH, vol. 515, No. 4, Nov. 14, 2006, pp. 2347-2352, XP005763083; ISSN: 0040-6090.
(Continued)

*Primary Examiner* — Daniel H Miller
(74) *Attorney, Agent, or Firm* — Harness, Dickey & Pierce, P.L.C.

(57) ABSTRACT

Methods involve a combination of polyelectrolyte multilayer (PEM) coating or silane self assembly on a substrate; microcontact printing; and conductive graphite particles, especially size controlled highly conductive exfoliated graphite nanoplatelets. The conductive graphite particles are coated with a charged polymer such as sulfonated polystyrene. The graphite particles are patterned using microcontact printing and intact pattern transfer on a substrate that has an oppositely-charged surface. The method allows for conductive organic patterning on both flat and curved surfaces and can be used in microelectronic device fabrication.

19 Claims, 2 Drawing Sheets

(51) Int. Cl.
*B82Y 10/00* (2011.01)
*B82Y 40/00* (2011.01)
*H05K 3/12* (2006.01)
*C01B 31/04* (2006.01)

(52) U.S. Cl.
CPC ...... *H05K 3/1275* (2013.01); *H05K 2201/0323* (2013.01); *H05K 2203/0108* (2013.01); *H05K 2203/09* (2013.01); *H05K 2203/105* (2013.01)

(56) References Cited

U.S. PATENT DOCUMENTS

| | | |
|---|---|---|
| 2005/0123687 A1 | 6/2005 | Jacobs et al. |
| 2006/0062982 A1* | 3/2006 | Hammond Cunningham et al. ........ 428/220 |
| 2006/0216222 A1* | 9/2006 | Jang ............................. 423/448 |

FOREIGN PATENT DOCUMENTS

| | | |
|---|---|---|
| WO | 02/03142 A | 1/2002 |
| WO | 2008/045745 A1 | 4/2008 |

OTHER PUBLICATIONS

Zheng, H., et al: "Two Component Particle Arrays on Patterned Polyelectrolyte Multilayer Templates", Advanced Materials, Wiley VCH, Weinheim, DE, vol. 14, No. 8, Apr. 18, 2002, pp. 569-572, XP001129789; ISSN: 0935:9648.

Jue Lu, et al: Stable Aqueous Suspension and Self-Assembly of Graphite Nanoplatelets Coated with Various Polyelectrolytes; Journal of Nanomaterials, vol. 2010, Article ID 186486, 11 pages.

* cited by examiner

US 9,023,478 B2

MICROPATTERNING OF CONDUCTIVE GRAPHITE PARTICLES USING MICROCONTACT PRINTING

CROSS-REFERENCE TO RELATED APPLICATIONS

This application is a divisional of U.S. application Ser. No. 12/515,232, filed May 15, 2009; which is a national phase application of PCT/US2007/023985, filed Nov. 15, 2007, which claims the benefit of U.S. Provisional Application No. 60/859,297, filed on Nov. 15, 2006. The disclosures of the above applications are incorporated herein by reference.

SPONSORSHIP

This invention was made with government support under CTS0609164 awarded by the National Science Foundation and FA9550-06-1-0417 awarded by the Air Force Office of Scientific Research. The U.S. Government may have has certain rights to the invention.

INTRODUCTION

Deposition of conductive materials onto substrates in small scale or micropatterns is a key to a wide variety of electronic applications. Many such industrial applications are experiencing high growth and include radio frequency identification (RFID) antenna fabrication, and the fabrication of electromagnetic interference (EMI) shielding materials.

Photolithography to form metal patterns has been a standard method for forming electronic circuits in electronic devices. Photolithography is an expensive step in the fabrication process. In addition, the materials that can be used in the process are somewhat limited and the method generally requires flat substrates. On the other hand, many fast growing areas of electronic technology, such as the RFID and EMI applications discussed above, require low cost fabrication techniques to deposit conductive materials on a variety of flexible surfaces using a wide range of materials.

SUMMARY

Methods of creating thin films with conductive organic patterns are described that can be formed on any surface for electronic device applications. In one aspect, the methods involve a combination of polyelectrolyte multilayer (PEM) coating or silane self assembly on a substrate; microcontact printing; and conductive graphite particles, especially size controlled highly conductive exfoliated graphite nanoplatelets, to create the thin films. In one aspect, the conductive graphite particles are coated with a charged polymer such as sulfonated polystyrene. The polymer coated graphite particle, which has an effective negative charge, is then patterned using microcontact printing on a substrate that has a surface charged oppositely to the graphite particle. In various embodiments, the charged surface on the substrate is provided by a polyelectrolyte multilayer or a self assembled monolayer. The method allows for conductive organic patterning on both flat and curved surfaces which can be used in microelectronic device fabrication. To illustrate, the PEMs can be deposited on a wide variety of surfaces. Using microcontact printing, negatively charged graphite patterns are transferred from a stamp to the positively charged outer surface of the multilayers. After rinsing, conductive patterns remain strongly bound on the surface.

DRAWINGS

The drawings described herein are for illustration purposes only and are not intended to limit the scope of the present disclosure in any way.

DESCRIPTION

Figure 1:
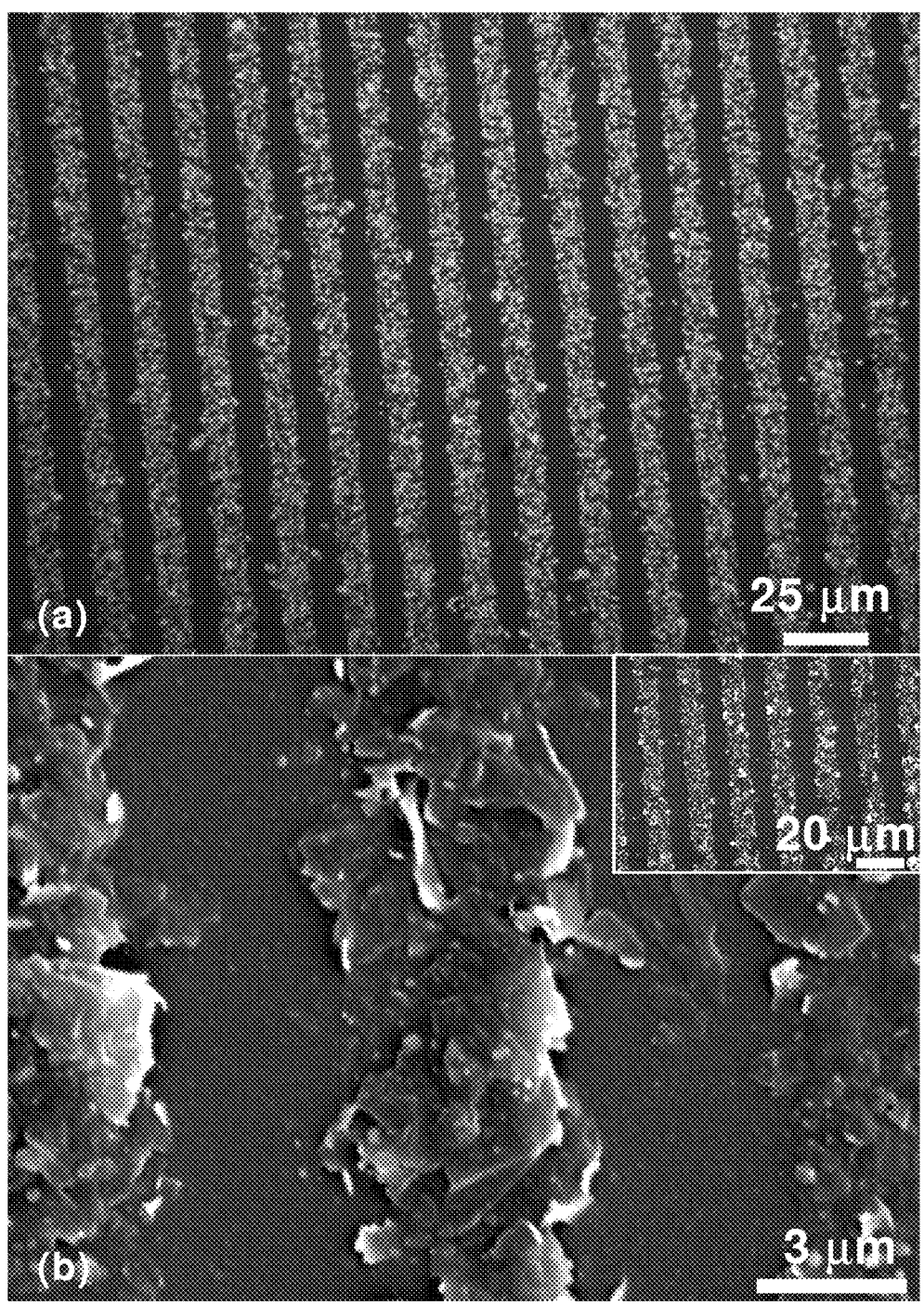
FIG. 1 shows micrographs of conductive particles on a substrate in a micropattern.

In one embodiment, the invention provides a method of depositing conductive materials onto substrates. The method involves providing a substrate having a charged surface layer and microcontact printing an oppositely charged conductive material onto the charged surface layer. Advantage is taken of the microcontact printing to print a conductive material and pattern that covers less than 100% of the surface with charged material. In various embodiments, the substrate is a polyelectrolyte multilayer (PEM) film and/or the conductive material comprises graphite. In a particular embodiment, the conductive material is made of exfoliated graphite nanoplatelets (x-GnP).

As noted, the conductive material is charged oppositely to the charge on the charged surface layer. In various embodiments, graphite is coated with a polyanion, while the charged surface onto which it is microcontact printed is cationic. In another embodiment, graphite is coated with a polycation and the charged surface layer is anionic.

In a further embodiment, the invention provides a method of fine patterning conductive material onto a surface for electronic applications. The method involves exposing high surface area graphite particles to a solution of a charged polymer to form a charged conductive material. In this step, the charged polymer attaches to the outside surface of the graphite particle. Next, the method involves applying an ink containing the charged conductive material to the surface of a stamp such as a microstamp. Then, the surface of the stamp is brought into contact with a PEM thin film, in which the PEM thin film has an outer surface with a charge opposite to that on the charged conductive material. The high surface area graphite particles have a surface area of 50 $m^2/g$ or greater, 75 $m^2/g$ or greater, and 100 $m^2/g$ or greater, in non-limiting embodiments.

In addition to high surface areas, the graphite particles are characterized in some embodiments by high aspect ratios. Thus in various embodiments, the aspect ratio of the graphite particles is 100 or higher. In a further embodiment, the aspect ratio is 1000 or higher. In various embodiments, the graphite particles comprise exfoliated graphite nanoplatelets that are coated with a polyanion or a polycation to provide a charged conductive material.

In another embodiment, the invention provides a method of depositing a pattern of conductive material on a surface. The method involves coating exfoliated nanoplatelets with a charged polymer and then forming an ink comprising the coated nanoplatelets. The ink is then applied to a microstamp and the coated nanoplatelets on the microstamp are transferred onto the surface by microcontact printing. In various embodiments, the surface has an outside layer with a charge opposite to that of the charged polymer coated on the exfoliated graphite nanoplatelets.

In various embodiments, applying an ink to the surface of a microstamp in the methods described herein involves layer by layer assembly of alternating layers of a) an ink comprising a charged conductive material (such as polyelectrolyte coated graphite particles) and b) a polyelectrolyte having a charge opposite of the charged conductive material. When such an ink applying step is used, microcontact printing or transferring the ink to a charged surface involves intact pattern transfer of the layer by layer assembled multilayer. The multilayer comprises alternating layers of a) graphite particles coated with a first polyelectrolyte and b) a second polyelectrolyte of opposite charge to the first polyelectrolyte.

In various embodiments, the nanoplatelets are coated with a polyanion, such as sulfonated polystyrene in an non-limiting example. In other embodiments, the nanoplatelets are coated with a polycation such as, without limitation, poly (diallyldimethyl ammonium) chloride (PDAC). In preferred embodiments, the surface onto which the coated platelets are transferred is a charged layer, such as the outer charged layer of a PEM film. Suitable PEM films include those having 10 or more bilayers of alternating polyanion and polycation.

In another embodiment, the invention provides exfoliated graphite nanoplatelets coated with a polyelectrolyte, such as a polyanion or a polycation. In various embodiments, the coated nanoplatelets have high surface areas and are characterized by a length to thickness aspect ratio of 1000 or higher and in particular 10,000 or higher.

The invention further provides a conductive circuit comprising exfoliated nanoplatelets deposited on a PEM thin film. In various embodiments, the nanoplatelets are deposited on the film in the form of an antenna such as an RFID antenna, or in the form of electromagnetic shielding materials. Thus, in various embodiments, the invention provides an RFID antenna comprising exfoliated graphite nanoplatelet conductive particles in a pattern on a surface laid down by any of the methods described herein.

In various embodiments, inks containing slurries or suspensions of graphite particles with a surface charge are applied onto microcontact stamps and then microprinted onto charged substrates. The inks contain graphite particles that, in a preferred embodiment, are coated with a charged polymer. The charged polymer contains either a negative or a positive charge. Non-limiting examples of charged polymers include sulfonated polystyrene, which carries a negative charge.

The graphite particles in various embodiments are graphite flakes, graphite nanotubes, exfoliated graphite nanoplatelets, expanded graphite, and the like, as well as mixtures. In preferred embodiments, the graphite particles are nanosized in that at least one dimension of the particle is less than 1 μm. Preferably, the graphite particles have a high surface area, which is believed to contribute to the adhesion of the polymer-coated particles on the substrate. In various embodiments, the graphite particles have a surface area of 50 $m^2$/g or higher. For example, the particles may have a surface area of 75 $m^2$/g or higher or 100 $m^2$/g or higher. In various embodiments, the particles have an aspect ratio of 100 or higher. In other embodiments, the particles have an aspect ratio of 1000 or higher or of 10,000 or higher. As the thickness of the particles decreases, the aspect ratio increases, given that the lateral diameter of the particle or platelet remains the same, and in general the surface area also increases. The upper limit of surface area, for example, approaches 2700 $m^2$/g for a theoretical or hypothetical single graphene sheet or monolayer graphite. The theoretical aspect ratio of such a structure is also very high. Practically available surface areas and aspect ratio are lower than the theoretical maxima.

In a preferred embodiment, the graphite particles comprise exfoliated nanoplatelets. Such nanoplatelets are described for example in U.S. Patent Publication 2006/0241237, published Oct. 26, 2006 by Drzal et al., the disclosure of which is hereby incorporated by reference.

Graphite is a layered material. Individual molecular layers are held together with weak Van der Waals forces and are capable of intercalation with organic or inorganic molecules and eventual expansion. These nanosized expanded graphite platelet materials are very large platelets having large diameters and are very thin in thickness. The graphite structure is stiff in bending. Graphite is a very good thermal and electrical conductor.

An expanded graphite is one that has been heated to separate individual platelets of graphite. An exfoliated graphite is a form of expanded graphite where the individual platelets are separated by heating with or without an agent such as a polymer or polymer component.

Typical starting materials to make exfoliated graphite nanoplatelets are natural graphite flakes intercalated with oxidizing agents, such as a sulfuric acid-based intercalated graphite obtained from UCAR international Inc. These intercalated graphite flakes are expanded, for example by exposure to microwave energy, typically at 2.45 GHz frequency for a few seconds to a few minutes in an oven, whereby they undergo significant expansion (for example, about 500 times). Pulverization using an ultrasonic processor follows to break down the worm-like structure resulting in individual graphite nanoplatelets that are less than 10 nm thick and have a diameter of about 15 μm. Their diameter can be further reduced by using a vibratory mill for a suitable time such as 72 hours, resulting in graphite nanoplatelets with the same thickness and diameter less than 1 μm.

The use of microwave (MW) energy or radiofrequency (RF) induction heating provides a fast and economical method to produce expanded graphite nanoflakes, graphite nanosheets, or graphite nanoparticles. In various embodiments, a graphite nanoplatelet is generally 10 nm or less in thickness and can range in size from 1 micron to 500 microns. "Nanoparticles" is used herein as a generic term for nanoflakes, nanosheets, nanoplatelets, and the like. Nanoflakes is a description of a starting material that is exfoliated into nanoplatelets. The microwave or RF methods are especially useful in large-scale production and are very cost-effective.

Chemically intercalated graphite flakes are expanded by application of the RF or microwave energy. The expansion occurs rapidly. Heating for 3-5 minutes removes the expanding chemical. The graphite absorbs the RF or microwave energy very quickly without being limited by convection and conduction heat transfer mechanisms. The intercalant heats up past the boiling point and causes the graphite to expand to many times its original volume. The process can be performed continuously by using a commercially available induction or microwave system with conveyors.

In various embodiments, the combination of RF or microwave expansion and appropriate grinding technique, such as planetary ball milling (and vibratory ball milling), produces nanoplatelet graphite flakes with a high aspect ratio efficiently. In general, such procedures reduce the "particle diameter", i.e. the x-y dimensions, but do not change the thickness. The pulverized graphite has an aspect ratio of 100, 1000 or 10,000 or higher. The surface area of the pulverized graphite is 50 $m^2$/g, 75 $m^2$/g, or 100 $m^2$/g or higher. Microwave or RF expansion and pulverization of the crystalline graphite to produce suitable graphite flakes enables control of the size distribution of graphite flakes more efficiently.

In various embodiments, nanoplatelets are prepared by expanding unexpanded intercalated graphite in the presence of a gaseous atmosphere with a chemical that expands upon heating to produce expanded graphite. The platelets generally are made of finely divided expanded graphite consisting essentially of platelets that are less than 300 µm in length and normally less than 0.1 µm (100 nm) in thickness. In various embodiments, the platelets are less than 200 µm in length, and/or less than 20 nm or less than 15 nm in thickness. The platelets are characterized by an aspect ratio (length over thickness of 100 or more, 1000 or more, up to about 10,000-100,000.

A precursor graphite used to make the exfoliated graphite nanoplatelets includes a graphite flake that has been treated with a fuming oxy acid and then heated to form the expanded graphite particles. Sulfuric acid is a non-limiting example of a suitable oxy acid.

In a preferred embodiment, the graphite particles are combined with a charged polymer. The charged polymer has a positive or negative charge and is applied onto the graphite particles to provide charge on the particle that will enable it to bind to the charged outer surface of the substrate. In a non-limiting example, the charged polymer is applied to the graphite particle by suspending the particles in a solution of the polymer and providing energy to the suspension by means of ultrasound, heat or other means. In a preferred embodiment, a suspension of the graphite particle in a solution of the charged polymer is ultrasonicated to apply the charged polymer to the graphite. An ink is then formed that contains a slurry or suspension of the polymer coated graphite particles.

In a subsequent step, the inks are applied to the surface of a stamp. The ink can be applied to a stamp by soaking the surface of the stamp in the ink for a suitable time. Depending on the concentration of the particles in the slurry, the nature of the charged polymer on the surface of the graphite particles, and other factors, the soaking time can be varied as desired to provide suitable build up of conductive particles on the stamp.

Stamps for microcontact printing are well known. In a preferred embodiment, the stamp is made of a polydimethylsiloxane (PDMS) material. Kits are commercially available for producing the stamps. In a preferred embodiment, an elastomeric stamp is made by curing PDMS on a microfabricated silicon master, which acts as a mold, to allow the surface topology of the stamp to form a negative replica of the master. To illustrate, PDMS stamps are made by pouring a 10:1 solution of elastomer and initiator over a prepared silicon master. In various embodiments, the silicon master is pretreated with fluorosilanes to facilitate the removal of the PDMS stamps from the masters. In a preferred embodiment, PDMS stamps are plasma treated to render the surface hydrophilic.

In various embodiments, it is preferred to provide a continuous layer of graphite particles on the stamp so that when it is later transferred to the charged surface of a substrate, the resulting conductive pattern exhibits suitable electronic performance. It has been observed that continuous patterns of graphite particles can be built up by increasing the soaking time and/or by sequential dipping of the stamp in the ink, wherein the total contact between the stamp and the ink is sufficient to form a continuous pattern of graphite particles. Thus, in various embodiments, soaking is carried out for a matter of minutes such as from 1-60 minutes, preferably from 1-20 minutes. Alternatively, the total soak or exposure time is divided into two or more dipping steps wherein the stamp is exposed to the ink for a time, then removed and the process repeated.

Thus, in various embodiments the ink is applied to the stamp by exposing the ink to the surface of the stamp for at least 1-2 minutes and preferably for at least 5 minutes. Alternatively, the stamp is dipped into the ink and soaked for a time, then the stamp is removed and the cycle is repeated, for example three times. Alternatively, solutions slurries or suspensions containing the graphite particles can be sprayed, brushed, or rolled on to the stamp surface. In general, the ink may be applied to the stamp in any known process.

In various embodiments, ink is applied to a stamp which contains a layer of polyelectrolyte having a charge opposite to the charged polymer coating the graphite particle. For example, a layer of polyelectrolyte alone (for example positively charged) is first absorbed onto the stamp. The stamp containing the polyelectrolyte is then dipped in or exposed to the ink containing the polymer coated charged graphite particles or nanoplatelets.

In a preferred embodiment, conductive multilayered polymer/exfoliated graphite nanoplatelet (xGnP™) nanocomposite films are created using layer by layer (LBL) assembly of films containing xGnP and the intact pattern transfer (IPT) of these films to a substrate. IPT is known from J. Park, L. D. Fouche, P. T. Hammond, Advanced Materials 2005, 17, 2575; J. Park, P. T. Hammond, Advanced Materials 2004, 16, 520; N. Kohli, R. M. Worden, I. Lee, Chemical Communications 2005, 316; and N. Kohli, R. M. Worden, I. Lee, Macromolecular Bioscience 2007, 7, 789, the disclosures of which are incorporated by reference.

In a non-limiting embodiment, multilayered graphite is exfoliated followed by milling to create size controlled xGnP as in K. Kalaitzidou, H. Fukushima, L. T. Drzal, Carbon 2007, 45, 1446 (incorporated by reference herein). The xGnP are then coated with a charged polymer to form a stable aqueous solution. The charged polymer can be cationic or anionic. The solution is then used for electrostatic LBL assembly, with an oppositely charged polyelectrolyte as the counter ion, onto the surface of an uncharged hydrophobic elastomeric stamp. LBL assembly proceeds by alternatingly exposing the stamp and the built up layers to first an ink comprising xGnP coated with a charged polymer and then to a polyelectrolyte of charge opposite that of the polymer coating the nanoplatelets. Once the film is formed, it is placed in direct contact with a substrate of the opposite charge to directly transfer the multilayer film. If enough layers of xGnP are adsorbed to the stamp, the LBL film becomes conductive. In various embodiments, four layers and six layers (or more) have been found sufficient to provide a film that transfers efficiently to a surface. Before LBL assembly on the stamp, the elastomeric stamp is coated with a layer of polyelectrolyte using relatively weak hydrophobic interactions between the stamp and film. When the stamp is removed from the substrate the strong electrostatic interactions between the oppositely charged films on the stamp and substrate hold the multilayer film on the substrate surface.

The substrate that will receive the graphite ink or the impact pattern transfer is also prepared with a changed surface. In one embodiment, the charged outer surface is anionic (an example is the polyanion outer layer of a PEM film as described herein). Polyelectrolyte multilayers are prepared layer-by-layer. In one exemplary process, they are prepared by sequentially immersing a substrate, such as silica, glass, or plastic slide, in alternating positively and negatively charged polyelectrolyte solutions in a cyclic procedure. A wide range of negatively charged and positively charged polymers is suitable for making the layered materials. Suitable polymers are water soluble and sufficiently charged (by virtue of the chemical structure and/or the pH state of the solutions) to form a stable electrostatic assembly of electrically charged polymers. Sulfonated polymers such as sulfonated polystyrene are commonly used as the negatively charged polyelectrolyte. Quaternary nitrogen-containing polymers such as poly (diallyldimethylammonium chloride) (PDAC) are commonly used as the positively charged electrolyte.

Other methods of layer-by-layer formation of PEM films are by spin casting, solution casting, and spray assembly of the alternating polyelectrolytes to build up a desired number of layers. These methods apply both to build up of layers on the substrate, and to deposition of inks containing charged conductive material on the microstamp.

Polyelectrolytes include positively and negatively charged polymers, and are also divided among "strong" and "weak" polyelectrolytes depending on whether the charged groups do or do not maintain their charge over a wide pH range. For example, a sulfonated polymer is considered a strong polyelectrolyte because it is negatively charged over a wide pH range; an acrylic acid polymer is considered a weak polyelectrolyte because it is protonated below a pH of about 4 but contains a negative charge at higher pH. Strong polyelectrolytes include sulfonated polystyrene (SPS) and poly (diallyldimethyl ammonium chloride) (PDAC). Weak polyelectrolytes include polyacrylics such as polyacrylic acid, as well as positively charged polyelectrolytes such as poly (allyl amine) and branched and linear polyethyleneimines as their respective ammonium salts.

Assembly of the PEM's is well known; an exemplary process is illustrated in Decher, Science vol. 277, page 1232 (1997), the disclosure of which is incorporated by reference. The method can be conveniently automated with robots and the like. In one embodiment, a polycation is first applied to a substrate followed by a rinse step. Then the substrate is dipped into a negatively charged polyelectrolyte solution for deposition of the polyanion, followed again by a rinse step. The procedure is repeated as desired until a number of layers is built up. In another embodiment, a polyanion is applied first to the substrate, followed by a polycation. In either case, alternating polycation and polyanion are applied to build up bilayers. A bilayer consists of a layer of polycation and a layer of polyanion. Thus for example, 10 bilayers contain 20 layers, while 10.5 bilayers contain 21 layers. With an integer number of bilayers, the top surface of the PEM has the same charge as the substrate. With a half bi-layer (e.g. 10.5 illustrated) the top surface of the PEM is oppositely charged to the substrate. Thus, PEM's can be built having either a negative or a positive charge "on top".

Instead of PEMs on the substrates, the substrates can contain self assembled monolayers (SAM) such as are provided by various silane materials that contain charged functional groups. In a non-limiting embodiment, a self-assembled monolayer is prepared on a substrate by exposing the substrate to a silane material containing a quaternary ammonium group. The self assembled monolayer in this case provides a positive charge that attracts the negative charge on the graphite particle to provide a conductive material on the substrate in the pattern provided by the stamp.

EXAMPLES

Poly(diallyldimethylammonium chloride) (PDAC, Mw~70,000), sulfonated poly(styrene), sodium salt (SPS, Mw~150,000), 6-carboxyfluorescein (6-CF) and nitrocellulose membranes (0.22 μm pore diameter) were purchased from Sigma-Aldrich (Milwaukee, Wis.) and used as received. Poly(dimethylsiloxane) (PDMS) was created using a Sylgard 184 kit from Dow Corning (Midland, Mich.). Poly(allylamine hydrochloride) (PAH, Mw 60,000) was obtained from Polysciences, Inc. (Warrington, Pa.). Graphite Intercalate Compounds (GIC) were purchased from UCAR Inc. Purified deionized (DI) water was obtained from a Barnstead Nanopure Diamond (Barnstead International, Dubuque, Iowa, resistivity>18.2 MΩ-cm) and used exclusively for all experiments. All polymer solution concentrations were based on the repeat unit of the polymer.

Example 1 xGnP Preparation xGnP Preparation:
xGnP are created using a process developed in the Composite Materials and Structures Centre and MSU. See H. Fukushima, Ph.D. Dissertation, Chemical Engineering & Materials Science, Michigan State University, (East Lansing, Mich.), 2003 and J. Lu, L. T. Drzal, R. M. Worden, I. Lee, Chemistry of Materials 2007, In Press [DOI: 10.1021/cm702133u]. GIC, which are acid intercalated graphite about 300 μm in size are expanded using microwave radiation. The microwaves cause the intercalated acids to evaporate quickly and expand the multilayered graphite. The expanded graphite is then ultrasonicated using a tip sonicator (see e.g. G. H. Chen, W. G. Weng, D. J. Wu, C. L. Wu, J. R. Lu, P. P. Wang, X. F. Chen, Carbon 2004, 42, 753). This creates xGnP of about 15 μm in diameter and 5-10 nm in thickness. The size of the xGnP is then reduced to a 0.5-1 μm diameter using ball milling, as disclosed in D. Cho, S. Lee, G. M. Yang, H. Fukushima, L. T. Drzal, Macromolecular Materials and Engineering 2005, 290, 179; K. Kalaitzidou, H. Fukushima, L. T. Drzal, Carbon 2007, 45, 1446; and K. Kalaitzidou, H. Fukushima, L. T. Drzal, Composites Science and Technology 2007, 67, 2045.

Example 2

Coated Graphite Particles and Inks xGnP used in the following experiments is 5-10 nm in thickness with a 0.5-1 μm diameter. 0.1 g of xGnP is added to a 100 mL aqueous solution containing 0.01 M SPS and 0.1 M NaCl. The solution is then tip sonicated with a Virsonic 100 (SP Industries Inc, Warminster, Pa.) for 30 min, agitated with stirring for 24 h and filtered using nitrocellulose membranes. The SPS coated xGnP are then redispersed in 100 mL of DI water and tip sonicated for 20 min. After sonication, any undispersed nanoplatelets on the surface of the solution are removed using wax paper. This xGnP-SPS solution (ink) is then used for LBL assembly.

Example 3

Film Preparation on PDMS

PDMS stamps are fabricated by pouring a degassed 10:1 prepolymer/initiator mixture over a patterned silicon wafer (Keck Microfabrication Facility, Michigan State University) and curing overnight in an oven at 60° C. The stamps are then placed in a 0.05 M solution of PAH at a pH of 7.5 or 10 for 20 min. The samples are then alternately dipped by hand into the xGnP-SPS solution of Example 2 and a solution containing 0.01 M PDAC and 0.1 M NaCl. The polymer dipping time is 20 min which is followed by two 5 min washing steps in water before the next polymer layer is adsorbed. Typically 4 or 6 bilayers are built up on the stamp, which has a positively charged outer PDAC surface.

Example 4

Substrate Film Preparation

A Carl Zeiss slide stainer (Richard-Allan Scientific, Kalamazoo, Mich.) is used to perform LBL assembly on glass microscope slides. Glass slides are prepared by bath sonication (Branson Ultrasonics Corporation, Danbury, Conn.) for 20 min in an aqueous Alconox (Alconox Inc., New York, N.Y.) solution followed by bath sonication for 10 min in DI water. The slides are then dried with nitrogen and oxygen plasma cleaned in a Harrick Plasma cleaner (Harrick Scientific Corporation, Broadway Ossining, N.Y.) for 10 min at a pressure of 125 mTorr. After plasma cleaning, LBL assembly of PDAC and SPS is performed using 20 minute immersion times followed by two 5 min washing steps to form 10 bilayers with a negatively charged SPS outer surface denoted as $(PDAC/SPS)_{10}$.

Example 5

Intact Pattern Transfer

The coated stamps are removed from the washing solution and gently dried with nitrogen. The composite film formed on a PDMS stamp with an outer PDAC surface is misted with DI water from a spray bottle and placed in conformal contact with the outer SPS surface on the PEM coated substrate. After one hour of contact time the stamp is removed and the xGnP containing film transferred to the surface due to the strong electrostatic forces.

Example 6

Characterization

Optical and fluorescent microscope images are obtained using a digital camera mounted on a Nikon Eclipse ME 600 or ME 400 respectively. 6-CF is dissolved in 0.1 M NaOH and used to selectively bind to positively charged regions on the surface. SEM images are obtained using a JOEL 6400V microscope equipped with a $LaB_6$ filament and operated at 8 keV. AFM images are obtained in tapping mode using a Nanoscope IV multimode scope (Digital Instruments). The conductivity of the samples is measured using Impedance Spectroscopy. Two copper tape electrodes are attached to the surface of the film and the resistance (R) is measured using a 0.1 V potential. The resistances are normalized by the dimensions of the films and reported as a surface resistivity ($\Omega_s$=R× L/D) where L is the length between the electrodes and D is the width of the electrode (see J. G. Smith, J. W. Connell, D. M. Delozier, P. T. Lillehei, K. A. Watson, Y. Lin, B. Zhou, Y. P. Sun, Polymer 2004, 45, 825 and L. Y. Ji, E. T. Kang, K. G. Neoh, K. L. Tan, Langmuir 2002, 18, 9035).

Example 7

In a typical process, multilayered graphite is expanded using acid intercalation, followed by exfoliation using ultrasonication (see for example D. Cho, S. Lee, G. M. Yang, H. Fukushima, L. T. Drzal, Macromolecular Materials and Engineering 2005, 290, 179; G. H. Chen, W. G. Weng, D. J. Wu, C. L. Wu, J. R. Lu, P. P. Wang, X. F. Chen, Carbon 2004, 42, 753; and X. S. Du, M. Xiao, Y. Z. Meng, Journal of Polymer Science Part B-Polymer Physics 2004, 42, 1972, the disclosures of which are incorporated by reference) and finally milled to create xGnP nanoplatelets (few layer graphene particles with a thickness of 1-10 nm and a 100-1000 nm diameter).

Since graphite is naturally hydrophobic, the xGnP need to be further modified with a polyelectrolyte to be used in LBL assembly from aqueous solutions. Illustrating for the case of an anionic polyelectrolyte, ultrasonication is used to disperse the xGnP in a solution containing a negatively charged polymer (e.g. sulfonated polystyrene, or SPS). The SPS coats the xGnP through interactions between the $sp^2$ hybridized graphitic surface and the aromatic rings of the polymer (see S. Stankovich, R. D. Piner, X. Q. Chen, N. Q. Wu, S. T. Nguyen, R. S. Ruoff, Journal of Materials Chemistry 2006, 16, 155). This coating facilitates the formation of a stable aqueous solution by preventing agglomeration of the SPS coated xGnP (xGnP-SPS) through like charge repulsion. This charge also enables the xGnP-SPS to be used for electrostatic LBL assembly. Zeta potential measurements confirm the negative charge of the xGnP-SPS.

Before LBL assembly, topographically patterned uncharged hydrophobic poly(dimethylsiloxane) (PDMS) stamps are coated with poly(allylamine hydrochloride) (PAH) using hydrophobic interactions at a pH of 7.5 or 10. The PDMS substrates are then placed into a solution containing xGnP-SPS, where the xGnP-SPS electrostatically deposits onto the PAH coated surface. After washing, the sample is then placed into a solution containing a positively charged polyelectrolyte, such as poly(diallyldimethylammonium chloride) (PDAC) where a second layer deposits on the surface. Repeated immersion into the xGnP-SPS and PDAC solutions creates multilayer films denoted as $PAH/(xGnP-SPS/PDAC)_n$ where n is the number of bilayers deposited on the PAH coated surface. The build up of multilayered films is confirmed by the gradually increasing darkness of the deposited film. The positive electrolyte (PDAC in the example) is typically the final layer adsorbed.

After the film is fabricated on the stamp, it is removed from solution, gently blown dry and placed in contact with a negatively charged PEM coated substrate. Contact times are typically one hour. Preferably the film is completely dry before the stamp is removed from the substrate.

FIG. 1 shows optical (FIG. 1a) and scanning electron microscope (SEM) images of the transferred patterns of the $PAH/(xGnP-SPS/PDAC)_4$ nanocomposite films using the IPT method. Films containing four and six bilayers could be patterned on areas as large as the stamp (1.5 cm×3 cm) using this technique. In the SEM image, FIG. 1b, the xGnP are observed in multilayer stacks created by the LBL process. Additionally, the xGnP packed densely enough on the surface to conduct electrical current. Atomic Force Microscope (AFM) analysis shows that the transferred four and six bilayer films have a thickness of 85 nm and 120 nm, respectively.

Example 8

Glass slides are coated with $(PDAC/SPS)_{10.5}$ bilayers. 0.1 g of exfoliated graphite nanoplatelets (approximately 1 µm in diameter with a 1-10 nm thickness) is dispersed in 100 ml 10 mM SPS solution with 0.1 M NaCl by sonication at 20 W for 30 minutes and then incubated for 24 hrs. The resulting SPS-coated graphite nanoparticles are filtered using a membrane with pore size of 0.22 µm and washed three times with DI water. SPS coated nanoparticles are then redispersed into 100 ml DI water by sonication at 10-15 W for 10 minutes. Plasma treated PDMS stamps are then soaked in the nanoparticle suspension/solution for 20 minutes. After soaking, the stamps are dried with nitrogen and placed in conformal contact with the PEM surface of the glass slide substrate.

Example 9

Alternatively, glass slides are coated with $(PDAC/SPS)_{10}$ bilayers. Exfoliated graphite nanoplatelets are coated with PDAC or PEI (polyethyleneimine) the same way as with SPS in Example 2. The nanoparticles have a positively charged surface. The pH value of a suspension of PEI-coated graphite nanoparticles is adjusted to 5-6. Before patterning, polymer coated nanoparticles are sonicated in a Branson sonication bath for 20 minutes. Plasma treated PDMS stamps are then soaked in the nanoparticle suspension/solution for 20 minutes. After soaking, the stamps are dried with nitrogen and placed in conformal contact with the PEM surface of the glass slide substrate Example 10

Surface Resistance of Films

Figure 2:
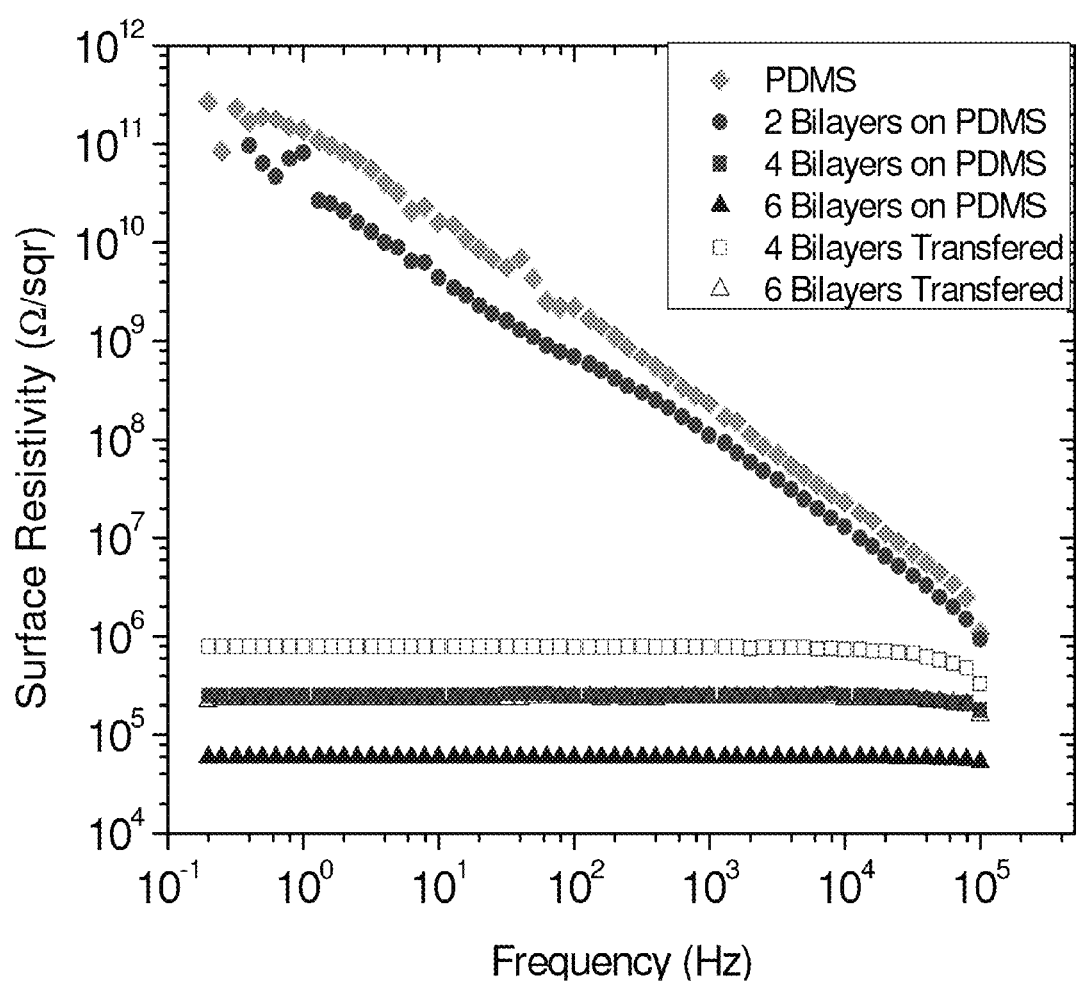
FIG. 2 shows the surface resistivity of multilayer films.

FIG. 2 shows the surface resistance of the films. The electrical properties of the films were determined by measuring the surface resistance. Films of xGnP-SPS were created on PAH adhesion layers at a pH of 7.5 or 10. However, the films formed onto the layers formed at 7.5 had a higher resistance than films formed on adhesion layers adsorbed at a pH of 10. FIG. 2 displays the results of measurements of xGnP-SPS films with an adhesion layer formed at a pH of 10. Uncoated PDMS substrates and two bilayers on PDMS were found to be nonconductive. (Samples on PDMS were measured without the final layer of PDAC.) However, when four bilayers are used, the percolation threshold is surpassed and the samples are found to be conductive. Six bilayer films on PDMS show the lowest surface resistivity of $5.8 \times 10^4$ Ohm/sqr. This resistance is comparable to previous reports by Kotov et al. which used exfoliated graphite created by oxidation to create the film, followed by a reduction step to render the film conductive, see N. A. Kotov, I. Dekany, J. H. Fendler, Advanced Materials 1996, 8, 637. However, our process does not include oxidation or reduction steps. In addition, we use a smaller number of layers, six instead of ten, to achieve nearly the same resistance. The addition of more bilayers could be used to further reduce the surface resistivity of the film.

Four and six bilayer films were transferred from PDMS to PEM coated glass slides. The surface resistance of these transferred films increased slightly. The increase in resistance is caused by the presence of the dense 4-5 nm PAH layer which covers the xGnP-SPS layer. We attempted to lower the resistance of the transferred films by removing the layer of PAH. Soaking the samples in a high pH solution to cause charge screening and removal of the PAH was unsuccessful. Additionally plasma treatment did not remove the PAH layer. Heating the samples to 275° C. for 3 hours to burn out the polymers also did not lower the measured resistance of the transferred six bilayer films. Films with surface resistivities in this range are potentially useful for controlling electrostatic charge dissipation and preventing damage to surrounding electronic equipment, as described for example in J. G. Smith, J. W. Connell, D. M. Delozier, P. T. Lillehei, K. A. Watson, Y. Lin, B. Zhou, Y. P. Sun, Polymer 2004, 45, 825 and L. Y. Ji, E. T. Kang, K. G. Neoh, K. L. Tan, Langmuir 2002, 18, 9035.

What is claimed is:

1. A conductive circuit comprising exfoliated graphite nanoplatelets disposed on a polyelectrolyte multilayer (PEM) thin film, wherein the PEM thin film consists of multiple layers of alternating oppositely charged polyelectrolytes, and wherein the nanoplatelets form a continuous pattern on an outer surface of the thin film.

2. The conductive circuit according to claim 1, wherein the exfoliated graphite nanoplatelets have a first surface charge and the PEM thin film has a second surface charge opposite the first.

3. A circuit according to claim 2, wherein the nanoplatelets are coated with a polyanion and the surface charge of the PEM thin film is cationic.

4. A circuit according to claim 2, wherein the nanoplatelets are coated with a polycation and the surface charge of the PEM thin film is anionic.

5. A circuit according to claim 1, wherein the surface area of the graphite nanoplatelets is 50 m$^2$/g or higher.

6. A circuit according to claim 1, wherein the surface area of the graphite nanoplatelets is 100 m$^2$/g or higher.

7. A circuit according to claim 2, wherein the aspect ratio of the nanoplatelets is 1000 or higher.

8. A circuit according to claim 3, wherein the polyanion is sulfonated polystyrene.

9. A circuit according to claim 4, wherein the cation is polydiallyldimethylammonium chloride.

10. A circuit according to claim 1, wherein the PEM thin film comprises alternating layers of sulfonated polystyrene and polydiallyldimethylammonium chloride.

11. A conductive circuit comprising a charged conductive material deposited by microcontact printing on an oppositely charged surface, surface of a polyelectrolyte multilayer (PEM) thin film, wherein the PEM thin film consists of multiple alternating layers of oppositely charged polyelectrolytes and wherein the charged conductive material comprises a layer by layer assembled multilayer comprising alternating layers of a) graphite particles coated with a first polyelectrolyte and b) a second polyelectrolyte of opposite charge to the first polyelectrolyte, wherein the layer by layer assembled multilayer is conductive.

12. A circuit according to claim 11, wherein the surface area of the graphite particles is 100 m$^2$/g or higher.

13. A circuit according to claim 11, wherein the graphite particles comprise exfoliated graphite nanoplatelets.

14. A circuit according to claim 13, wherein the aspect ratio of the nanoplatelets is 1000 or higher.

15. A circuit according to claim 11, wherein the polyelectrolyte multilayer thin film comprises 10 or more bilayers of alternating polyanion and polycation.

16. A circuit according to claim 11, wherein the layer by layer assembled multilayer comprises 4 or more alternating layers of graphite particles a) and second polyelectrolyte b).

17. A circuit according to claim 11, in the form of an antenna.

18. A circuit according to claim 11, in the form of an RFID antenna.

19. A circuit according to claim 11, in the form of an electromagnetic interference shielding material.

* * * * *

UNITED STATES PATENT AND TRADEMARK OFFICE
CERTIFICATE OF CORRECTION

PATENT NO. : 9,023,478 B2
APPLICATION NO. : 13/619696
DATED : May 5, 2015
INVENTOR(S) : Ilsoon Lee et al.

Page 1 of 1

It is certified that error appears in the above-identified patent and that said Letters Patent is hereby corrected as shown below:

In the specification

Col. 1, Line 20 - After "Government" delete "may have"

In the claims

Col. 12, Claim 11, Line 30 - After "charged" delete "surface,"

Signed and Sealed this
Tenth Day of November, 2015

Michelle K. Lee
*Director of the United States Patent and Trademark Office*